US012676631B2

(12) United States Patent
Egan

(10) Patent No.: US 12,676,631 B2
(45) Date of Patent: Jul. 7, 2026

(54) DIGITAL-TO-ANALOG CONVERTERS WITH TRIODE SWITCHES

(71) Applicant: MediaTek Inc., Hsin-Chu (TW)

(72) Inventor: Nathan Egan, San Jose, CA (US)

(73) Assignee: MEDIATEK INC., Hsinchu City (TW)

( * ) Notice: Subject to any disclaimer, the term of this patent is extended or adjusted under 35 U.S.C. 154(b) by 230 days.

(21) Appl. No.: 18/324,035

(22) Filed: May 25, 2023

(65) Prior Publication Data

US 2024/0113727 A1      Apr. 4, 2024

Related U.S. Application Data

(60) Provisional application No. 63/378,257, filed on Oct. 4, 2022.

(51) Int. Cl.
| | |
|---|---|
| *H03M 1/66* | (2006.01) |
| *H03M 1/74* | (2006.01) |
| *H03M 1/80* | (2006.01) |

(52) U.S. Cl.
CPC ........... *H03M 1/808* (2013.01); *H03M 1/745* (2013.01)

(58) Field of Classification Search
CPC ...... H03M 1/745; H03M 3/464; H03M 1/002; H03M 1/0604; H03M 1/08; H03M 1/68; H03M 1/00; H03M 1/662; H03M 1/682; H03M 1/687; H03M 1/808; H03M 1/06; H03M 1/089; H03M 1/74; H03M 1/765; H03M 1/1009; H03M 1/1057; H03M 1/664; H03M 1/0607; H03M 1/0612; H03M 1/0617; H03M 1/066; H03M 1/068; H03M 1/0836; H03M 3/424; H03M 3/454; H03M 3/502; H03M 1/007; H03M 1/0609; H03M 1/0614; H03M 1/0624; H03M 1/0626; H03M 1/0643; H03M 1/0646; H03M 1/0665; H03M 1/067; H03M 1/0673; H03M 1/0682; H03M 1/069; H03M 1/0697;
(Continued)

(56) References Cited

U.S. PATENT DOCUMENTS

| | | | | | |
|---|---|---|---|---|---|
| 6,329,940 | B1 * | 12/2001 | Dedic | ................. | H03M 1/0827 341/144 |
| 6,650,265 | B1 * | 11/2003 | Bugeja | .................. | H03M 1/002 341/145 |

(Continued)

*Primary Examiner* — Linh V Nguyen
(74) *Attorney, Agent, or Firm* — Winston Hsu

(57) ABSTRACT

Current steering digital-to-analog converters (DACs) are described. These DACs are suitable for high speed operation. Weight transistors conventionally used in DACs are replaced with resistors, resulting in a lower RC constant. Further, the resistors cause a smaller voltage drop, thus improving the voltage headroom of the DAC. Additionally, the current steering switches are biased in the triode region, as opposed to the saturation region as in conventional designs. Biasing the switches in the triode region results in a smaller drain-source voltage, which further improves the voltage headroom of the DAC. The triode operation further results in a substantially smaller output impedance, which leads to the output voltage being dictated primarily by the output transistor of the current path. Lastly, reset switches are added which reduce data-dependent memory effects that can otherwise produce distortion.

14 Claims, 8 Drawing Sheets

(58) Field of Classification Search
CPC ............. H03M 1/0827; H03M 1/0881; H03M
1/1004; H03M 1/1014; H03M 1/1023;
H03M 1/1047; H03M 1/1061; H03M
1/108; H03M 1/46; H03M 1/661; H03M
1/76; H03M 1/80; H03M 1/806; H03M
1/822; H03M 3/30; H03M 3/32; H03M
3/326; H03M 3/348; H03M 3/356; H03M
3/386; H03M 3/496; H03M 3/50
USPC ................................. 341/135, 136, 144, 153
See application file for complete search history.

(56) References Cited

U.S. PATENT DOCUMENTS

| | | | | |
|---|---|---|---|---|
| 6,977,602 | B1 * | 12/2005 | Ostrem | H03M 1/0863 |
| | | | | 341/145 |
| 8,094,055 | B2 * | 1/2012 | Gaknoki | H03M 1/68 |
| | | | | 341/145 |
| 8,976,050 | B1 * | 3/2015 | Dedic | H03M 1/0624 |
| | | | | 341/110 |
| 9,264,062 | B1 * | 2/2016 | Kabir | G01S 7/35 |
| 9,379,728 | B1 * | 6/2016 | Singh | H03M 1/1047 |
| 9,385,742 | B1 * | 7/2016 | Cheng | H03M 1/742 |
| 9,419,636 | B1 * | 8/2016 | Graham | H03M 1/0836 |
| 9,991,900 | B1 * | 6/2018 | Kabir | H03M 1/0673 |
| 11,394,393 | B1 * | 7/2022 | Lahiri | H03M 1/661 |
| 11,956,019 | B1 * | 4/2024 | Singh | H04B 10/508 |
| 2010/0289680 | A1 * | 11/2010 | Ho | H03M 1/1057 |
| | | | | 341/145 |
| 2020/0112471 | A1 * | 4/2020 | Mehrpoo | H04B 1/04 |
| 2023/0387870 | A1 * | 11/2023 | Wang | H03F 3/187 |

* cited by examiner

| Voltage | Transistors |
|---|---|
| Vswp0 | T1, T9, T11 |
| Vswn0 | T2, T10, T12 |
| Vswp1 | T3, T6, T8 |
| Vswn1 | T4, T5, T7 |

DIGITAL-TO-ANALOG CONVERTERS WITH TRIODE SWITCHES

CROSS REFERENCE TO RELATED APPLICATIONS

This application claims priority under 35 U.S.C. § 119(e) to U.S. Provisional Application No. 63/378,257, entitled "DIGITAL-TO-ANALOG CONVERTER" filed on Oct. 4, 2022, which is herein incorporated by reference in its entirety.

BACKGROUND

Digital-to-analog converters are electronic circuits that convert digital data into analog signals. Digital-to-analog converters are commonly used in audio and video applications, such as in music players to convert digital audio streams into the analog audio signals and in displays to convert digital video streams into analog video signals. Further, digital-to-analog converters are used extensively in modern communication systems. For example, ultra-high-speed converters are commonly used in fiber optics.

BRIEF SUMMARY

Some embodiments relate to a digital-to-analog converter (DAC), comprising: a plurality of DAC unit cells, at least one of the plurality of DAC unit cells comprising: a resistor; a plurality of current paths, each current path comprising a current steering switch coupled to the resistor and an output transistor coupled to the current steering switch; and a controller configured to bias at least one of the current steering switches of the plurality of current paths in triode.

Some embodiments relate to a digital-to-analog converter (DAC), comprising: a plurality of current steering DAC unit cells, each of the plurality of current steering DAC unit cells comprising: a resistor; first, second, third and fourth current paths, each current path comprising a current steering switch coupled to the resistor and an output transistor coupled to the respective current steering switch; a plurality of reset switches coupled between respective current steering switches and output transistors of the current paths; and a plurality of current sources coupled to respective current steering switches of the current paths; and a controller configured to bias the current steering switches of the plurality of current paths in triode sequentially.

Some embodiments relate to a method for controlling a digital-to-analog converter (DAC) comprising a plurality of DAC unit cells, at least one of the plurality of DAC unit cells comprising first, second, third and fourth current paths, each current path comprising a current steering switch and an output transistor coupled to the current steering switch, the method comprising: at a first time, biasing the current steering switch of the first current path in triode and deactivating each of the current steering switches of the second, third and fourth current paths; and at a second time, biasing the current steering switch of the third current path in triode and deactivating each of the current steering switches of the first, second, and fourth current paths.

The foregoing summary is provided by way of illustration and is not intended to be limiting.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing.

DETAILED DESCRIPTION

I. Overview

Figure 1:
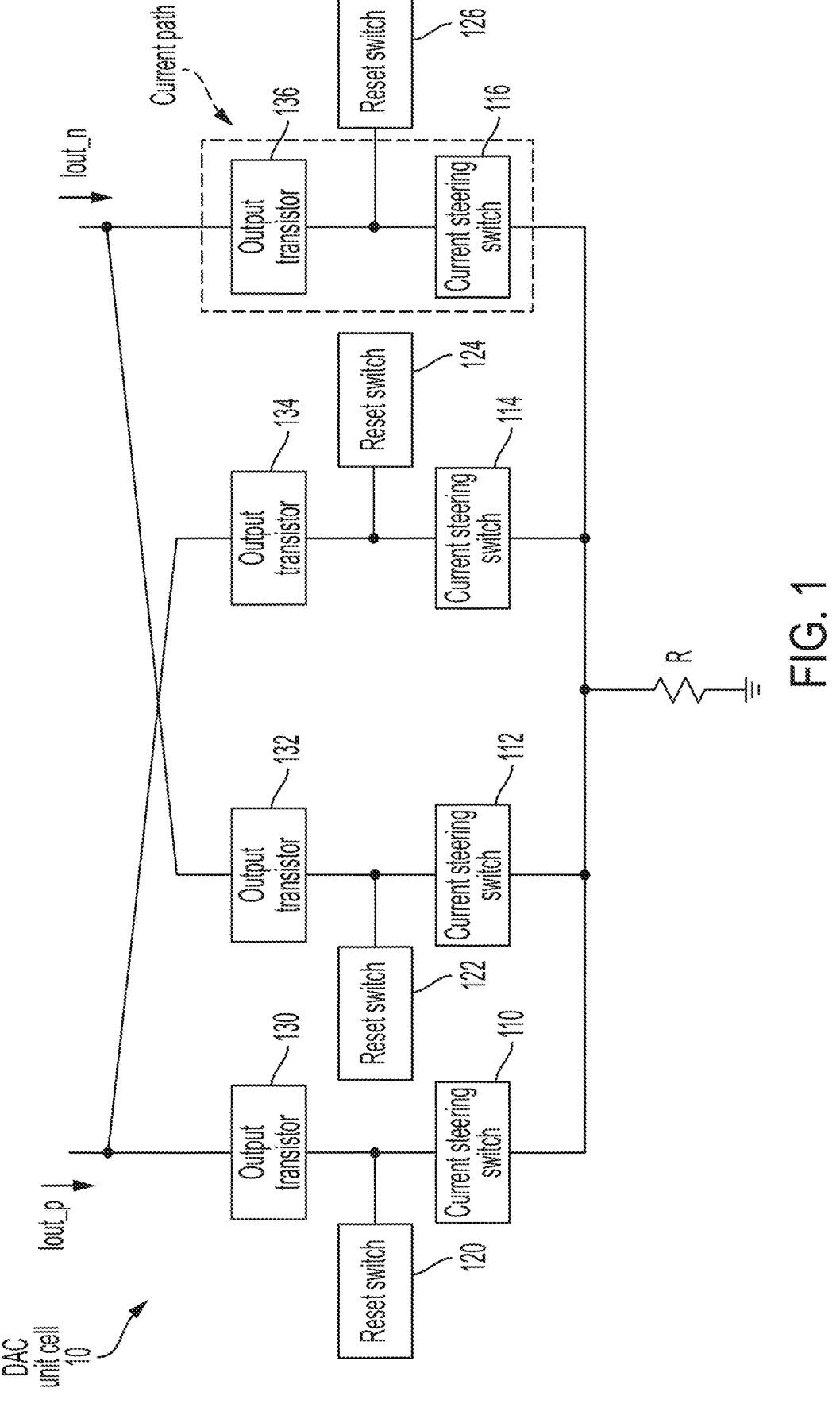
FIG. 1 is a block diagram of a current steering digital-to-analog converter (DAC) unit cell, in accordance with some embodiments.

Described herein are current steering digital-to-analog converters (DACs) suitable for high speed operation, for example in the order of 10 GHz or more. The DACs developed by the inventor and described herein improve upon previous current steering DAC implementations, as discussed in detail below.

The inventor has recognized and appreciated that conventional current steering DACs present several undesired effects. First, drain-source voltage drops occurring across the current steering switches limit the available voltage headroom, pushing the voltage supply to higher-than-ideal values. To limit power usage, in some circumstances, it is desirable to supply a DAC with 0.9 V at most. Unfortunately, the limited voltage headroom arising in conventional current steering DACs can push the voltages supply well above 1.2 V. Second, maintaining current matching across the various switches is often accomplished using relatively large transistors. Matching the dimensions of transistors, in fact, can be accomplished more easily with large transistors than with small transistors, as inevitable variations due to fabrication tolerances represent a smaller change in percentage. However, large transistors produce large capacitance, which reduces the speed of the DAC. Third, some conventional current steering DACs are susceptible to distortion caused by data-dependent performance. The DAC can respond differently depending upon the input pattern, introducing distortion and making the DAC's performance somewhat unpredictable.

The DACs developed by the inventor address the limitations described above using one or more of the following aspects of the technology described.

In accordance with a first aspect, the weight transistors are replaced with resistors. The resistors result in a lower RC constant than what is possible with transistors because resistors can be made smaller while still ensuring proper matching. Further, the resistors cause a smaller voltage drop, thus improving the voltage headroom of the DAC.

In accordance with a second aspect, the current steering switches are biased in the triode region, as opposed to the saturation region as in conventional designs. Biasing the switches in triode results in a smaller drain-source voltage, which further improves the voltage headroom of the DAC. Additionally, the triode operation results in the switch having a substantially smaller output impedance than it would be possible in saturation. Therefore, the overall output impedance of the unit cell is dictated primarily by the output transistor and by the resistor. Thus, the matching of the transistors is not as critical as in conventional designs, allowing for a reduction in the dimension of the transistor. This further reduces capacitance and improves speed.

In accordance with a third aspect, reset switches are added. The reset switches allow toggling between the phases of the DAC—which reduces data-dependent effects that can otherwise produce distortion—while minimizing the undesired effects of the circuit's capacitance. In the absence of a reset switch, in response to a switch being turned off, the output voltage decays at a rate that is limited by the capacitance of the circuit. The reset switch forces the voltage to reach the desired value in substantially less time.

Using one or more of the aspects described above, conversion speeds in the order (or in excess) of 10 GHz can be achieved.

II. Current Steering DACs

FIG. 1 is a block diagram of a current steering digital-to-analog converter (DAC) unit cell, in accordance with some embodiments. DAC unit cell 10 is configured to convert a 1-bit input into the analog domain. To convert multi-bit inputs, multiple instances of this unit cell may be used. As will be clearer from FIG. 2, DAC unit cell 10 can be viewed as a current steering DAC in that it includes multiple current source/switch pairs. Current steering is performed by activating or deactivating the switches to which the current sources are coupled. Depending on how current is steered, the output current of the DAC unit cell can be represented by Iout_n or Iout_p, as illustrated in FIG. 1.

DAC unit cell 10 includes four current paths, where each current path includes a current steering switch and an output transistor. Current steering switch 110 and output transistor 130 form a first current path; current steering switch 112 and output transistor 132 form a second current path; current steering switch 114 and output transistor 134 form a third current path; current steering switch 116 and output transistor 136 form a fourth current path. In some embodiments, the current paths may operate as degenerated current sources. It should be appreciated that, while the following figures illustrate transistors being implemented as metal-oxide-semiconductor field-effect-transistor (MOSFETs), any other suitable type of transistor may be used, including bipolar junction transistors (BJTs) and junction field effect transistors (JFETs). Thus, as used herein, the term "gate" indicates the gate of a field effect transistor or the base of a bipolar transistor, the term "source" indicates the source of a field effect transistor or the emitter of a bipolar transistor and the term "drain" indicates the drain of a field effect transistor or the collector of a bipolar transistor.

Switches 110, 112, 114 and 116 are biased in the triode region when activated. Biasing the transistor in triode reduces the drain-source voltage drop to substantially zero. Conventional DACs rely on switches operating in the saturation region to perform current steering. The inventor has recognized that although operating the switches in saturation has certain advantages, it leads to a significant drain-source voltage drop. The voltage drop limits the available voltage headroom, pushing the voltage supply to higher-than-ideal values. To limit power usage, in some circumstances, it is desirable to supply a DAC with 0.9 V at most. Unfortunately, the limited voltage headroom arising in conventional current steering DACs can push the voltages supply well above 1.2 V. By contrast, operating the switches in triode has virtually no impact on the supply voltage as the drain-source voltage drop is substantially zero.

Operating the switches in triode presents an additional benefit. Maintaining current matching across the switches of a current steering DAC is often accomplished using relatively large transistors. Matching the dimensions of transistors, in fact, can be accomplished more easily with large transistors than with small transistors, as inevitable variations due to fabrication tolerances represent a smaller change in percentage. However, large transistors produce large capacitance, which reduces the speed of the DAC. Operating the switches in triode leads to a substantially lower output impedance than would be the case had the switch been biased in saturation. This means that the output impedance of the unit cell is dictated primarily by the output transistor and the resistor. This relaxes the requirement that the dimensions of the switch transistors be perfectly matched, allowing for a reduction in the dimension of the switch transistors. This reduces the capacitance of the switches and, as a result, improves the overall speed of the DAC.

DAC unit cell 10 includes a resistor R coupled between ground (or a negative supply voltage) and the sources of the current steering switches. The current across resistor R sets the weight of the DAC unit cell, and depends upon the value or resistor R, the drop across the current steering switch and the source voltage of the output transistor. In some embodiments, the value of the resistors of the various unit cells (see FIG. 3) is matched. In such embodiments, the currents output by the various unit cells are matched. In other embodiments, the resistance of the resistors of the various unit cells are different, allowing for current scaling between the units.

In some conventional current steering DACs, the unit cell current weight is set using a transistor—the drain-source impedance of the transistors provides the weight. The inventor has recognized and appreciated that use of a transistor to set the weight of a DAC unit cell leads to two issues: 1) a high RC constant, which results in a slower DAC; and 2) a larger-than-ideal voltage drop, which, again, reduces the voltage headroom of the DAC unit cell. Recognizing these limitations, the inventor proposes replacing the weight transistor with resistor R. The resistor results in a lower RC constant than what is possible with a transistor because resistors can be made smaller while still ensuring proper matching with the other resistors. Further, the resistors cause a smaller voltage drop, thus improving the voltage headroom of the DAC. In some embodiments, the value of resistor R may be between 100 s of Ω to multiple kΩ.

DAC unit cell 10 further includes reset switches coupled to the current paths. More specifically, reset switch 120 is coupled between current steering switch 110 and output transistor 130; reset switch 122 is coupled between current steering switch 112 and output transistor 132; reset switch 124 is coupled between current steering switch 114 and output transistor 134; reset switch 126 is coupled between current steering switch 116 and output transistor 136. The inventor has recognized and appreciated that use of reset switches in the manner described herein allows toggling between the phases of the DAC, which reduces data-dependent effects while minimizing the undesired effects of the circuit's capacitance. In the absence of a reset switch, in response to a current steering switch being turned off, the output voltage decays at a rate that is limited by the capacitance of the circuit, which leads to distortion. The reset switch forces the voltage to reach the desired value in substantially less time, thus increasing the overall speed of the DAC.

III. MOSFET-Based Implementations

Figure 2:
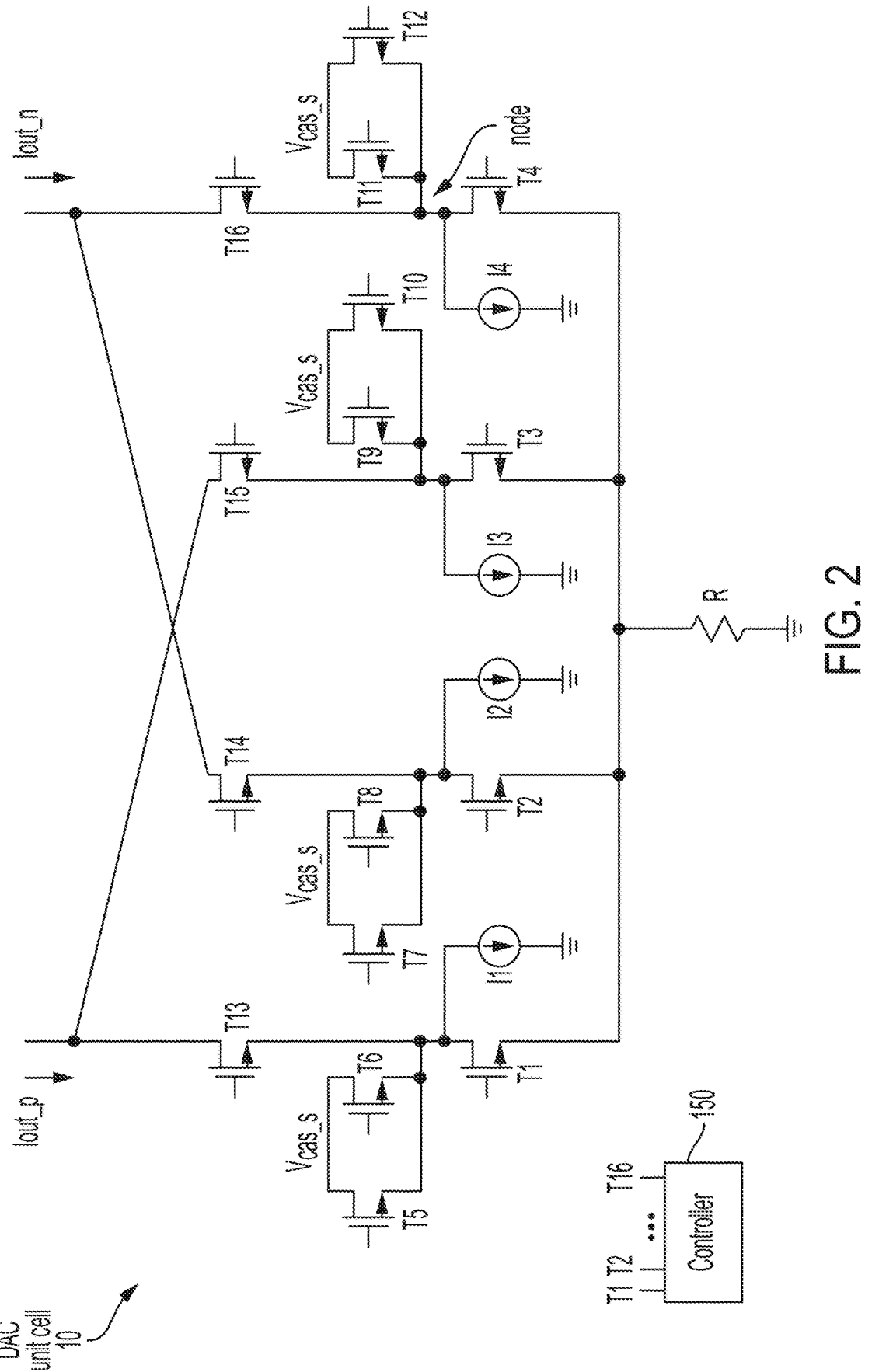
FIG. 2 is a circuit diagram illustrating an implementation of the current steering DAC unit cell of FIG. 1 using MOSFETs, in accordance with some embodiments.

FIG. 2 is a circuit diagram illustrating a MOSFET-based implementation of the current steering DAC unit cell of FIG. 1, in accordance with some embodiments. It should be noted that other types of transistors are also possible. For example, the MOSFETs of FIG. 2 are nMOS, but pMOS implementations are also possible.

The current steering switches of FIG. 1 are implemented using transistors T1, T2, T3 and T4. The output transistors of FIG. 1 are implemented using transistors T13, T14, T15 and T16. Current source I1 is coupled to the drain of T1; current source I2 is coupled to the drain of T2; current source I3 is coupled to the drain of T3; current source I4 is coupled to the drain of T4. The drain of T13 is coupled to the drain of T15; the drain of T14 is coupled to the drain T16. Current steering is performed by activating and deactivating transistors T1-T4.

Current sources I1-I4 can be viewed as "keep-alive" or "bleed" current sources. Current sources I1-I4 provide constant currents that do not change with the data. The weight of these current sources is usually a fraction of the unit current. When the triode switches are open, current sources I1-I4 maintain a small amount of current flowing in transistors T13-T16. This allows for much faster settling once the triode transistor is closed.

Each reset switch is implemented using a pair of reset transistors in parallel to each other. In some embodiments, using a pair of reset transistors ensures proper reset operation. For example, depending on the input data, it is possible that either reset transistor T9 or T10 does not toggle at every clock cycle. The combination of T9 and T10, however, does toggle at every clock cycle. However, other implementations are also possible. Transistor T5 is in parallel with transistor T6; transistor T7 is in parallel with transistor T8; transistor T9 is in parallel with transistor T10; transistor T11 is in parallel with transistor T12. When at least one of the pair of reset transistors is activated, the voltage at the drain of the corresponding triode transistor is forced to voltage Vcas_s, substantially reducing the decay time relative to implementations lacking reset transistors. Controller 150 controls the voltages to be applied to the gates of transistors T1-T16.

Figure 3:
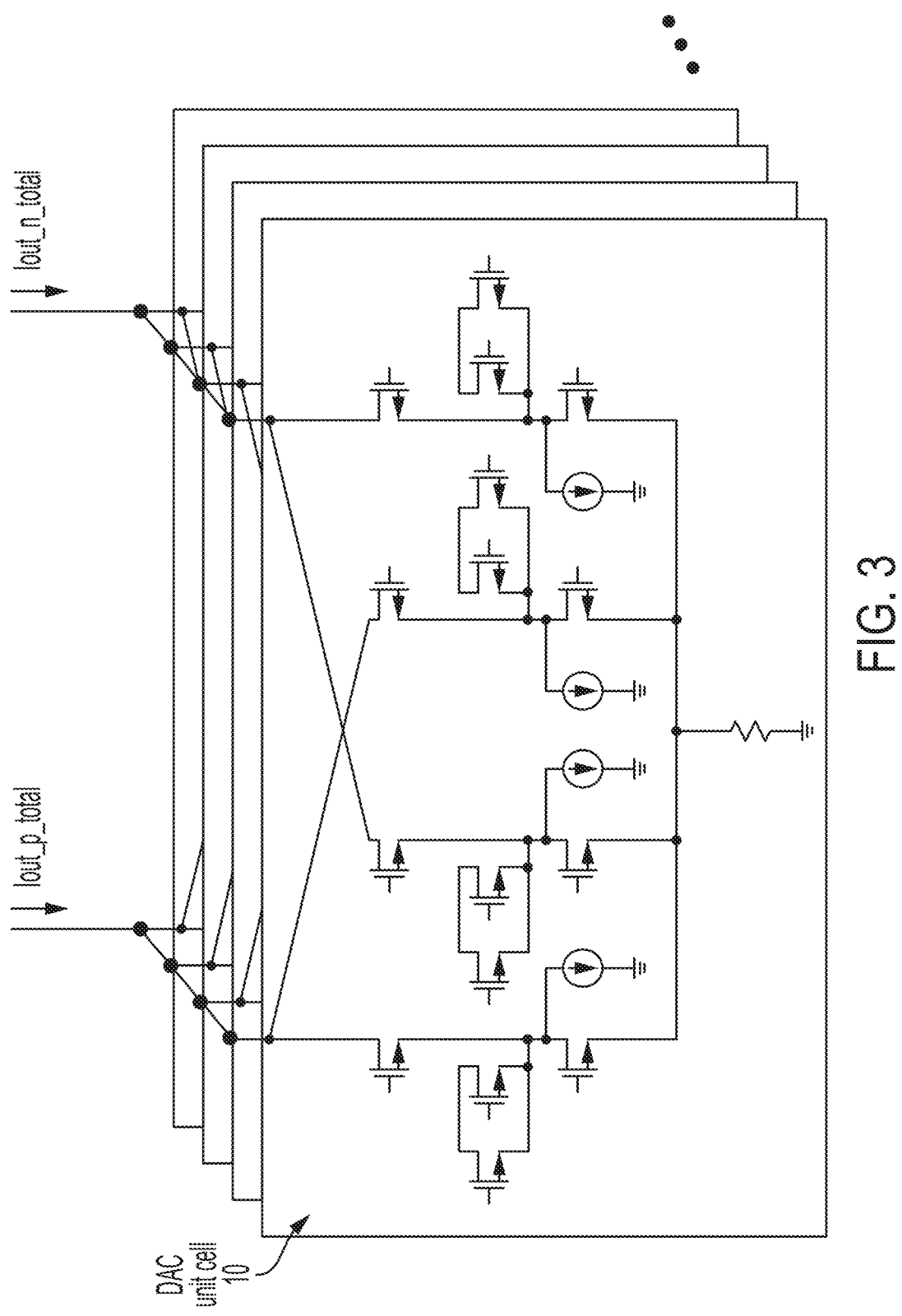
FIG. 3 is a block diagram of a current steering DAC including multiple DAC unit cells, in accordance with some embodiments.

FIG. 3 is a block diagram illustrating a multi-bit DAC including instances of the DAC unit cell of FIG. 2. The output currents of the DAC unit cells are combined together to produce currents Iout_n_total or Iout_p_total. Depending on whether the weight resistance of the various cells is matched or not, the current contribution of each cell may be the same or may be different.

Figures 4A, 4B:
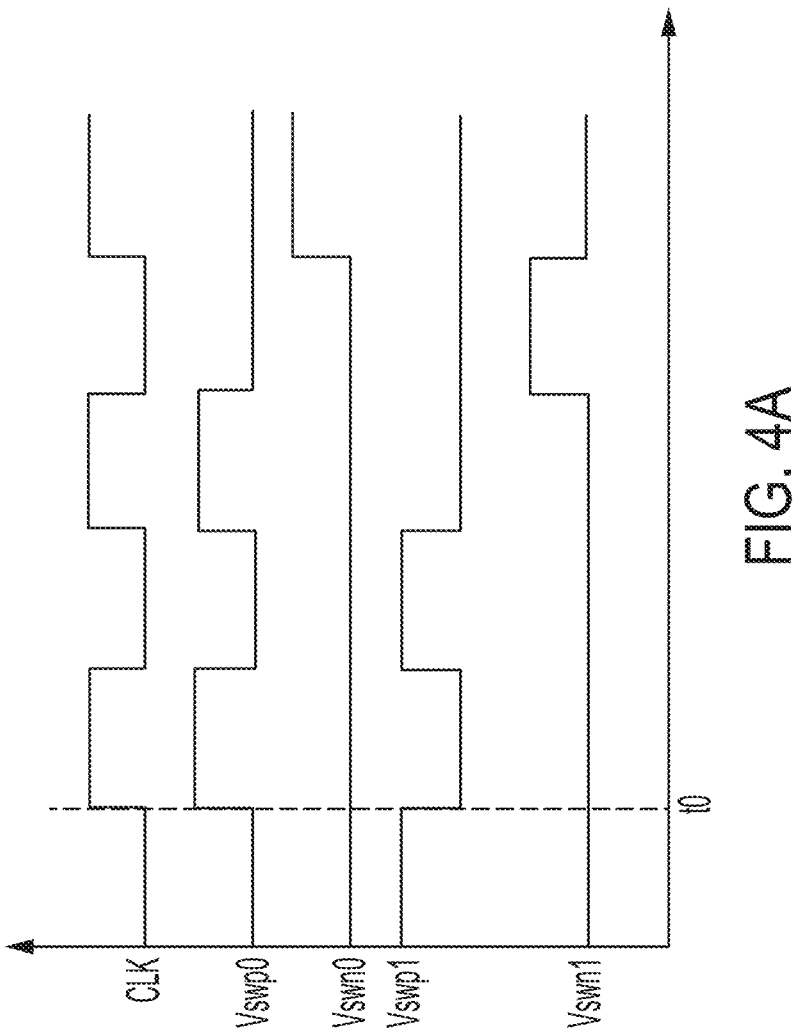
FIG. 4A is a time diagram illustrating control signals for controlling the operation of the DAC unit cell of FIG. 2, in accordance with some embodiments.
FIG. 4B is a table mapping the control signals of FIG. 4A to the transistors of FIG. 2, in accordance with some embodiments.

FIG. 4A is a time diagram illustrating control signals output by controller 150 for controlling the operation of the DAC unit cell of FIG. 2. FIG. 4B is a table mapping the control signals of FIG. 4A to the transistors of FIG. 2. As shown in the table, control signal Vswp0 controls the state of transistors T1, T9 and T11; control signal Vswn0 controls the state of transistors T2, T10 and T12; control signal Vswp1 controls the state of transistors T3, T6 and T8 and control signal Vswn1 controls the state of transistors T4, T5 and T7. It should be noted that other configurations are also possible. The control signals are fed to the gates of the respective transistors. The on-values of the control signals may be chosen to bias transistors T1-T4 in triode, when activated. In some embodiments, the on-values of the control signals may be further chosen to bias transistors T5-T12 in triode, when activated.

When activated, the reset switches force the voltage at the output of the corresponding switch (referred to herein as the "node") to Vcas_s, effectively clearing memory effects arising as a result of residual electric charge. In some embodiments, reset operations may be performed in a manner that is data-independent. For example, on every given clock cycle, the number of nodes that are reset may remain constant, although the particular node being reset may vary over time.

Figure 4C:
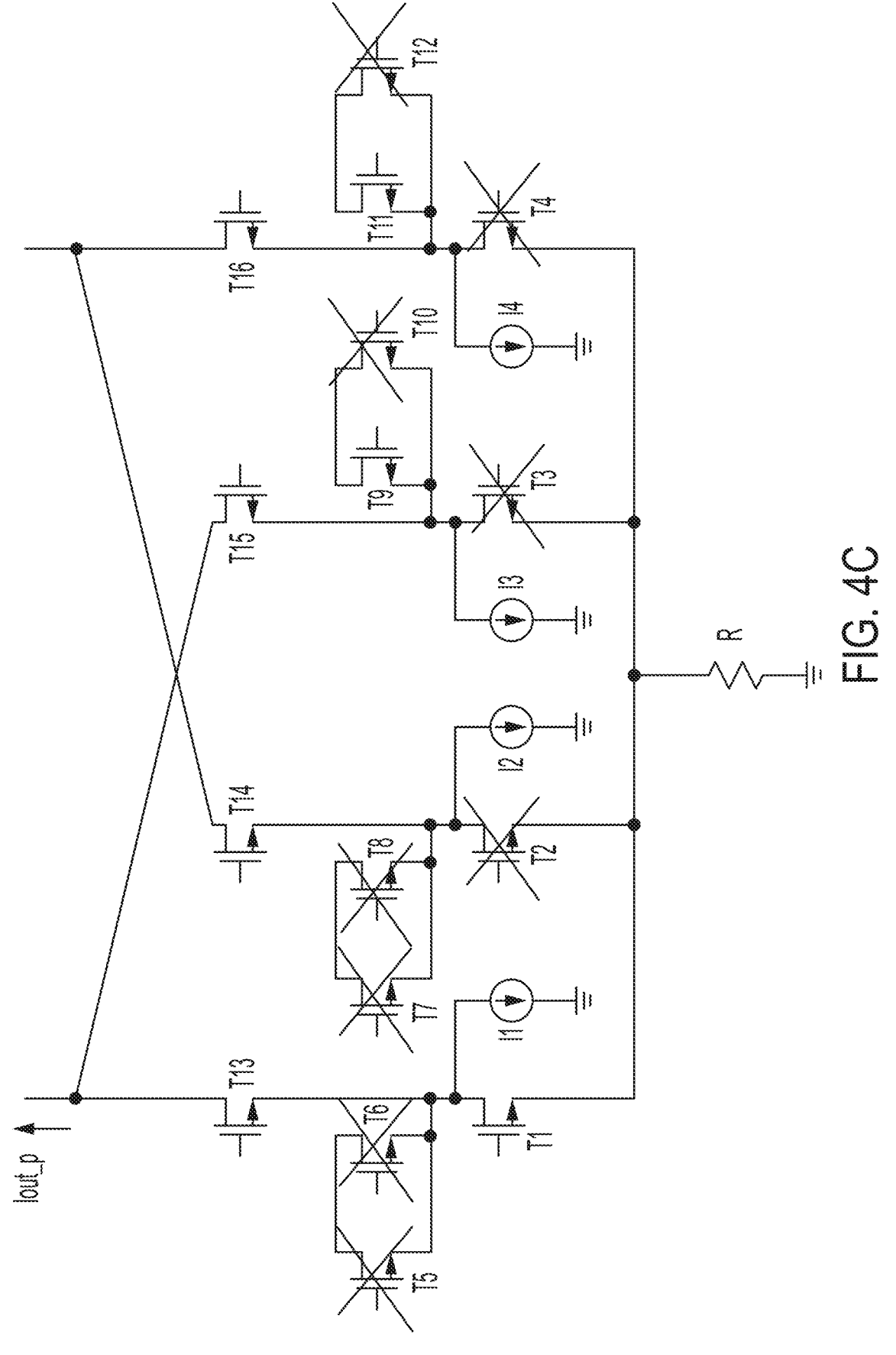
FIG. 4C is a circuit diagram illustrating the current steering DAC unit cell of FIG. 2 when controlled using the control signals of FIG. 4A, in accordance with some embodiments.

Referring back to FIG. 4A, the control signals are represented in relationship with a clock clk. At the clock edge corresponding to time t0, control signal Vswp0 toggles from 0 to 1 and control signal Vswp1 toggles from 1 to 0. The result of this is illustrated in FIG. 4C. Transistor T1 is activated (in triode), transistor T2 remains deactivated, transistor T3 is deactivated and transistor T4 remains deactivated. As a result, current is steered to the path that passes through transistor T1. Transistors T9 and T11 are activated, thereby resetting the voltage of the corresponding nodes to Vcas_s. In this way, data-dependent memory effects are cleared. The output transistor of the current path sets the output current and boosts the output impedance of the DAC. Further, the output transistor of the current path protects the DAC against large voltage swings that may occur during operation of the DAC.

The active switch—T1 in this case—produces a virtually zero drain-source voltage drop because it operates in triode, thus improving the voltage headroom of the DAC relative to saturation-based switch implementations. Further, operating in triode results in the output impedance of the switch being substantially smaller than what would be possible with switches operating in saturation. The impedance may be, for example, between 50Ω and 200Ω. The result is that the output current being dictated primarily by the drain of the output transistor and resistor R. Because of this, perfect current matching between the switches is not as critical as in saturation-based implementations, thereby relaxing the requirement that the geometries of the switches be perfectly matched. This, in turn, enables designers to design smaller switches, thus reducing RC effects (and improving speed).

Figure 5A:
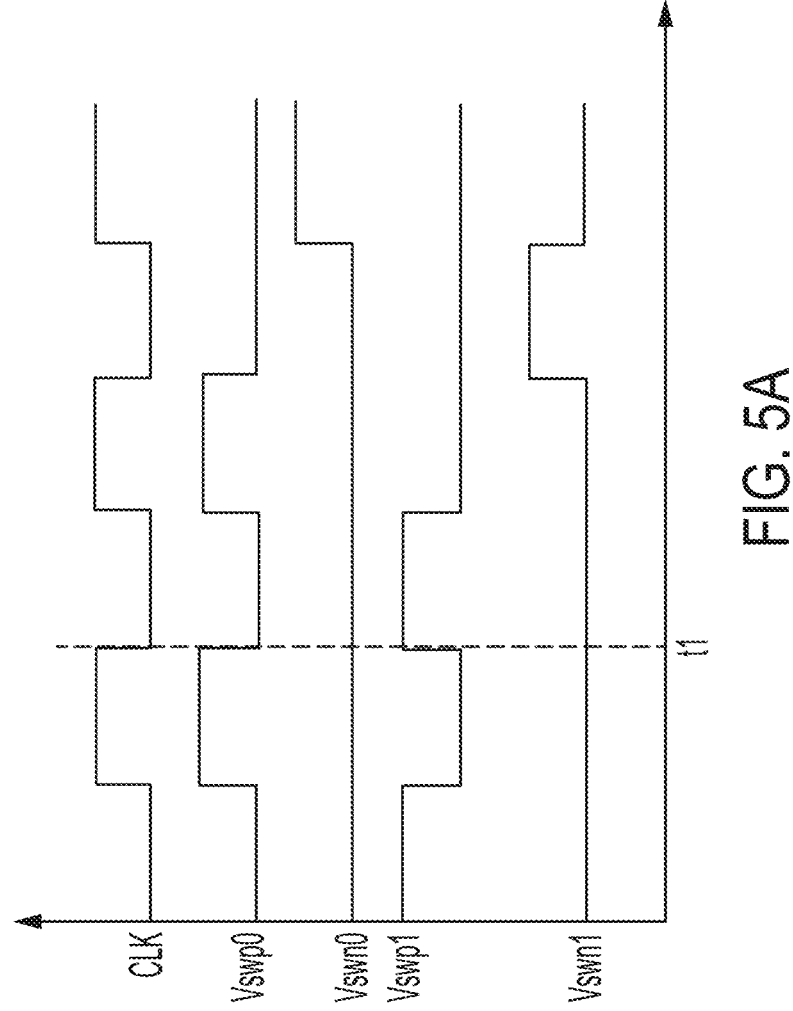
FIG. 5A is another time diagram illustrating control signals for controlling the operation of the DAC unit cell of FIG. 2, in accordance with some embodiments.
Figure 5B:
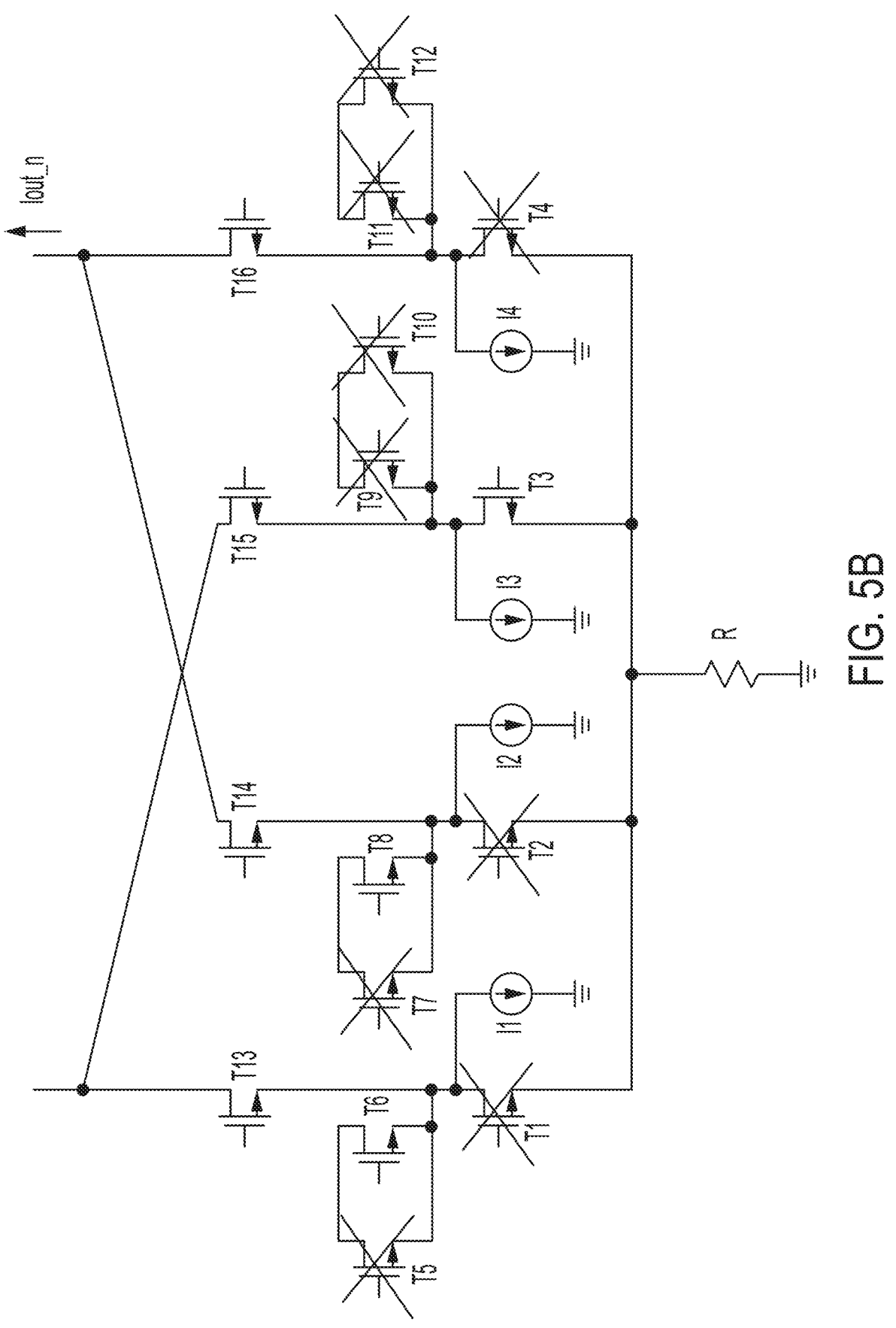
FIG. 5B is a circuit diagram illustrating the current steering DAC unit cell of FIG. 2 when controlled using the control signals of FIG. 5A, in accordance with some embodiments.

In some embodiments, current may be redirected every half clock cycle. The diagram of FIG. 5A represents the value of the control signals at time t1, which occurs half a clock cycle after time t0. At this time, control signal Vswp0 toggles back to 0 and control signal Vswp1 toggles back to 1. The result is illustrated in FIG. 5B. Transistor T1 is deactivated and transistor T3 is activated (in triode). Transistors T6 and T8 are activated, thereby resetting the voltage at the corresponding node to Vcas_s, and clearing data-dependent memory effects.

As further illustrated in FIG. 5A, when control signals Vswn1 toggles to 1, control signal Vswp0 toggles to 0 and control signal Vswp1 remains at 0 (having toggled half a cycle earlier). The result (not shown in the figures) is that transistors T4, T5 and T7 are activated, while all other transistors are deactivated (whether they were previously active or already inactive). Further, when control signals Vswn0 toggles to 1, control signal Vswn1 toggles back to 0. The result (not shown in the figures) is that transistors T2, T10 and T12 are activated, while all other transistors are deactivated (whether they were previously active or already inactive). Thus, only one among the current steering switches is activated (in triode) at any given time. In this respect, the DAC may be viewed as biasing the current steering switches in triode sequentially.

Figure 6:
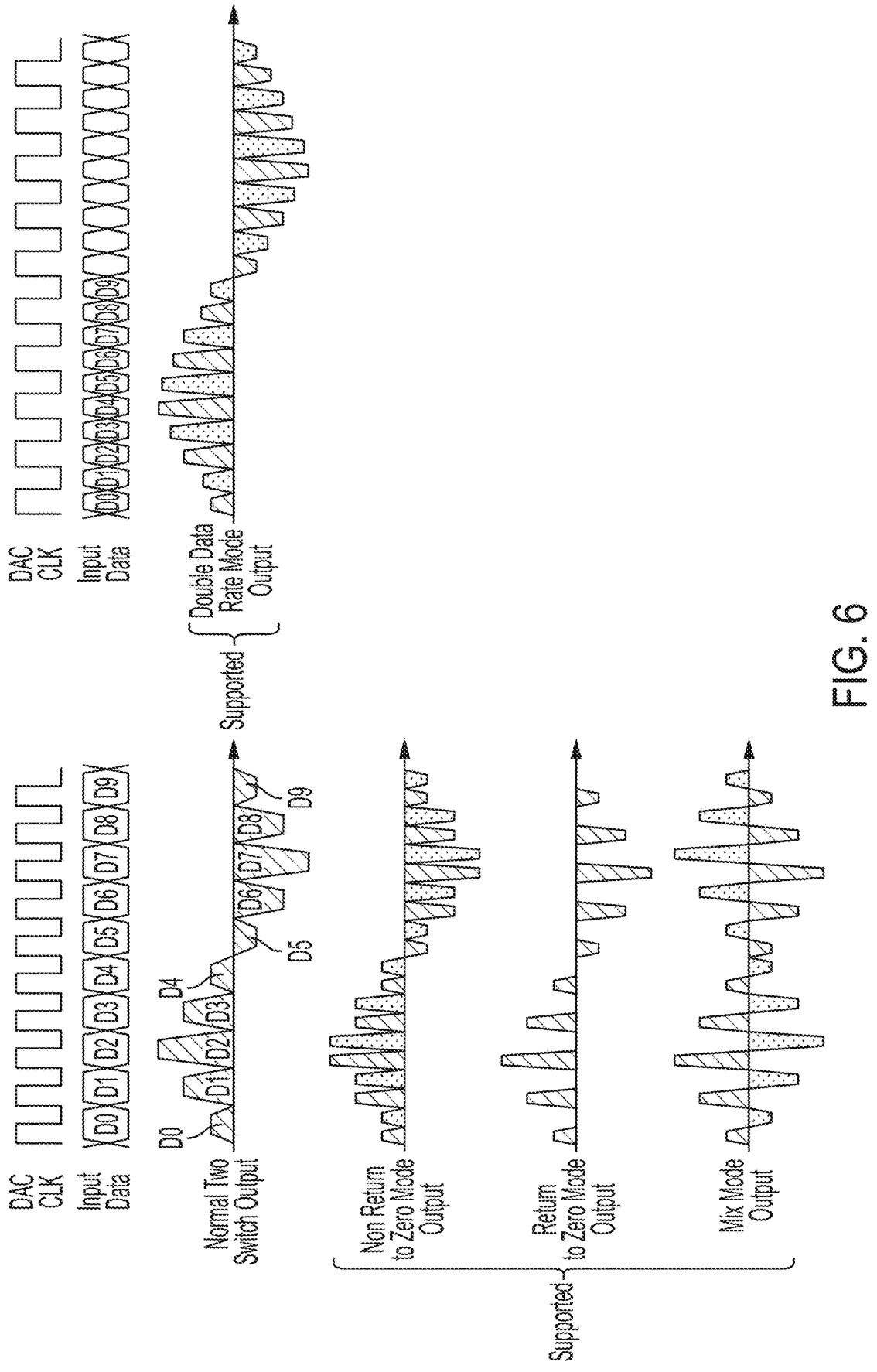
FIG. 6 illustrates different operation modes supported by the DAC unit cell of FIG. 1, in accordance with some embodiments.

DACs of the types described herein may be operated in several modes. FIG. 6 illustrates the operation modes supported by the DACs (other than the normal two switch mode, in which a new input bit is processed at every clock cycle). The non-return to zero mode is such that, if the input bit is held to 0 (for example), the unit cells close transistor T1 on one clock edge and transistor T3 on the following clock edge. Switching is therefore data independent because each node closes, opens or resets once every clock cycle. The output of the return to zero mode differs from the output of the normal two switch mode in that, every half clock cycle, current is set to 0. The output of the mix mode is similar to the output of the non-return to zero mode in that, every half clock cycle, current is steered from one side to another. However, the mix mode differs from the non-return to zero mode in that, every half clock cycle, the sign of the output current is changed.

Lastly, the double data rate mode allows processing of two input bits per clock cycle. One bit is processed in the first half of the clock cycle, another bit is processed in the second half. As a result, the throughput of the DAC is doubled.

IV. Conclusion

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including", "comprising", "having", "containing" or "involving" and variations thereof herein, is meant to encompass the items listed thereafter and equivalents thereof as well as additional items.

The use of "coupled" or "connected" is meant to refer to circuit elements, or signals, that are either directly linked to one another or through intermediate components.

The terms "approximately", "substantially," and "about" may be used to mean within ±10% of a target value in some embodiments. The terms "approximately" and "about" may include the target value.

What is claimed is:

1. A digital-to-analog converter (DAC), comprising:
a plurality of DAC unit cells, at least one of the plurality of DAC unit cells comprising:
a resistor;

a plurality of current paths, each current path comprising a current steering switch coupled to the resistor and an output transistor coupled to the current steering switch; and
a controller configured to bias at least one of the current steering switches of the plurality of current paths so that a transistor within the at least one of the current steering switches operates in triode region;
wherein the plurality of current paths comprises first, second, third and fourth current paths, the output transistor of the first current path being coupled to the output transistor of the third current path to generate a first output current of the DAC unit cell, and the output transistor of the second current path being coupled to the output transistor of the fourth current path to generate a second output current different from the first output current of the DAC unit cell;
wherein each of the first, second, third and fourth current paths comprises a reset switch coupled between the respective current steering switch and the respective output transistor, and the controller is further configured to:
at a first time, bias the current steering switch of the first current path in triode and deactivate each of the current steering switches of the second, third and fourth current paths, and activate the reset switch of the third current path and deactivate each of the reset switches of the first, second and fourth current paths;
at a second time, bias the current steering switch of the third current path in triode and deactivate each of the current steering switches of the first, second, and fourth current paths, and activate the reset switch of the first current path.

2. The DAC of claim 1, wherein the at least one of the plurality of DAC unit cells further comprises a plurality of reset switches coupled between respective current steering switches and output transistors.

3. The DAC of claim 2, wherein a source of a first reset switch of the plurality of reset switch is coupled to a drain of the respective current steering switch and is further coupled to a source.

4. The DAC of claim 2, wherein at least one of the plurality of reset switches comprises a first reset transistor and a second reset transistor in parallel to each other.

5. The DAC of claim 1, wherein the controller is further configured to: at the second time, activate the reset switch of the second current path and deactivate each of the reset switches of the second and third current paths.

6. The DAC of claim 1, wherein the resistor is coupled to ground.

7. The DAC of claim 1, wherein the resistor is coupled to a source of the current steering switch.

8. The DAC of claim 1, wherein the at least one of the plurality of DAC unit cells further comprises a current source coupled to the current steering switch.

9. A digital-to-analog converter (DAC), comprising:
a plurality of current steering DAC unit cells, each of the plurality of current steering DAC unit cells comprising:
a resistor;
first, second, third and fourth current paths, each current path comprising a current steering switch coupled to the resistor and an output transistor coupled to the respective current steering switch;
a plurality of reset switches coupled between respective current steering switches and output transistors of the current paths; and a plurality of current sources coupled to respective current steering switches of the current paths; and a controller configured to bias the current steering switches of the plurality of current paths so that transistors within the current steering switches operate in triode region sequentially;

wherein biasing the switches of the plurality of current paths in triode sequentially comprises:

at a first time, biasing the current steering switch of the first current path in triode and deactivating each of the current steering switches of the second, third and fourth current paths, and activating the reset switch of the third current path and deactivating each of the reset switches of the first, second and fourth current paths; and at a second time, biasing the current steering switch of the third current path in triode and deactivating each of the current steering switches of the first, second, and fourth current paths, and activating the reset switch of the first current path.

10. The DAC of claim 9, wherein biasing the current steering switches of the plurality of current paths in triode sequentially further comprises:

at the second time, activating the reset switch of the second current path and deactivating each of the reset switches of the second and third current paths.

11. The DAC of claim 9, wherein each of the plurality of reset switches comprises a first reset transistor and a second reset transistor in parallel to each other.

12. The DAC of claim 9, wherein the resistor is further coupled to ground.

13. A method for controlling a digital-to-analog converter (DAC) comprising a plurality of DAC unit cells, at least one of the plurality of DAC unit cells comprising first, second, third and fourth current paths, each current path comprising a current steering switch and an output transistor coupled to the current steering switch, the method comprising:

at a first time, biasing the current steering switch of the first current path so that a transistor within the current steering switch of the first current path operates in triode region and deactivating each of the current steering switches of the second, third and fourth current paths; and at a second time, biasing the current steering switch of the third current path so that a transistor within the current steering switch of the third current path operates in triode region and deactivating each of the current steering switches of the first, second, and fourth current paths;

wherein each of the first, second, third and fourth current paths comprises a reset switch coupled between the respective current steering switch and the respective output transistor, further comprising:

at the first time, activating the reset switch of the third current path and deactivating each of the reset switches of the first, second and fourth current paths; and at the second time, activating the reset switch of the first current path.

14. The method of claim 13, further comprising:

at the second time, activating the reset switch of the second current path and deactivating each of the reset switches of the second and third current paths.

* * * * *